(12) United States Patent
Payan et al.

(10) Patent No.: US 8,487,712 B2
(45) Date of Patent: Jul. 16, 2013

(54) SYSTEM FOR TRANSMITTING AN ELECTRIC PULSE AND DEVICE FOR CAPACITIVE DISCONNECTION FOR SUCH A SYSTEM

(75) Inventors: Denis Payan, Mervilla (FR); Denis Schwander, Labarthe sur Leze (FR)

(73) Assignee: Centre National d'Etudes Spatiales, Paris (FR)

( * ) Notice: Subject to any disclaimer, the term of this patent is extended or adjusted under 35 U.S.C. 154(b) by 569 days.

(21) Appl. No.: 12/452,237

(22) PCT Filed: Jun. 19, 2008

(86) PCT No.: PCT/FR2008/051110
§ 371 (c)(1),
(2), (4) Date: Oct. 22, 2010

(87) PCT Pub. No.: WO2009/004260
PCT Pub. Date: Jan. 8, 2009

(65) Prior Publication Data
US 2011/0102097 A1      May 5, 2011

(30) Foreign Application Priority Data

Jun. 20, 2007   (FR) ...................................... 07 04393

(51) Int. Cl.
*H03H 7/38*      (2006.01)
(52) U.S. Cl.
USPC .......................................................... 333/32

(58) Field of Classification Search
USPC ..................................................... 333/32, 33
See application file for complete search history.

(56) References Cited

FOREIGN PATENT DOCUMENTS
EP       1 443 687        8/2004

OTHER PUBLICATIONS

Fukunaga et al. "Internal space charge measurement for space environment monitoring." Proceedings of the 7th International Conference on Properties and Application of Dielectric Materials, vol. 2, Jun. 1, 2003, pp. 662-664.
Takada. "Acoustic and Optical Methods for Measuring Electric Charge Distributions in Dielectrics." IEEE Transactions on Dielectrics and Electrical Insulation, IEEE Service Center, vol. 6, No. 5, Oct. 1, 1999, pp. 519-547.
Wu et al. "Capacitively decoupled tunable loop microstrip (TLM) array at 7 T" Magnetic Resonance Imaging, Elsevier Science, vol. 25, No. 3, Mar. 19, 2007, pp. 418-424.

*Primary Examiner* — Stephen Jones
(74) *Attorney, Agent, or Firm* — Jacobson Holman PLLC

(57) ABSTRACT

The invention relates, in particular, to a system for transmitting at least one electric pulse for an apparatus for determining a distribution of charges contained in the thickness of an item (2) made of a dielectric material, said transmission system including a transmitter electrode (1) for transmitting at least one pulse and a generator (3) of said pulse. The system is notable in that said electrode is formed by a transmission line (1) which is substantially level in relation to the item (2) to be analyzed and which includes impedance matching means to keep said impedance substantially constant along said transmission line in the passband of said pulse.

22 Claims, 4 Drawing Sheets

SYSTEM FOR TRANSMITTING AN ELECTRIC PULSE AND DEVICE FOR CAPACITIVE DISCONNECTION FOR SUCH A SYSTEM

This is a national stage of PCT/FR08/051110 filed Jun. 19, 2008 and published in French, which has a priority of French no. 07/04393 filed Jun. 20, 2007, hereby incorporated by reference.

The invention relates to a system for transmitting an electric pulse for an apparatus for determining a distribution of charges contained in the thickness of an item made of dielectric material.

The invention aims in particular to allow both the electric decoupling of a transmitter electrode transmitting an electric pulse, from which the charge distribution can be determined, and the high-voltage polarization of the transmitter electrode.

The system according to the invention provides for identifying a distribution of charges in the thickness of an electrically charged dielectric item with improved effectiveness at exciter pulse transmission.

Systems for analyzing the distribution of charges in the thickness of items are known, which are designed to apply a "pulsed electroacoustic" (PEA) method. This PEA method aims to determine the density, distribution and polarity of charges contained in the item to be analyzed.

The principle of the PEA method is to apply a short-duration pulse on an item placed between two electrodes, with the aim of probing the material. Under the effect of the initial electric pulse, the charges contained in the material move parallel to the electric field produced and return to their initial position. This movement of charges generates an electroacoustic wave which propagates in the direction of the field. This wave, the amplitude of which is proportional to the quantity of charges contained or induced on the electrodes, moves towards the surface of the analyzed item at a speed which is specific to the material from which the analyzed item is produced. The depth of the charges in the item is deduced from this speed. The receiver electrode is equipped with a piezoelectric sensor which converts the acoustic wave into an electric signal. The latter is amplified and transmitted to a measurement oscilloscope which enables the signal to be visualized. A data-processing system for the electric signal, associated with software and programmed with a reference measurement, then delivers information concerning the spatial distribution of charges contained in the analyzed item.

Such a method is in particular described in the article entitled "INNOVATIVE PEA SPACE CHARGE MEASUREMENT SYSTEMS FOR INDUSTRIAL APPLICATIONS" (IEEE Electric Insulation Magazine, March/April 2004, Vol. 20, No. 2).

Figure 1:
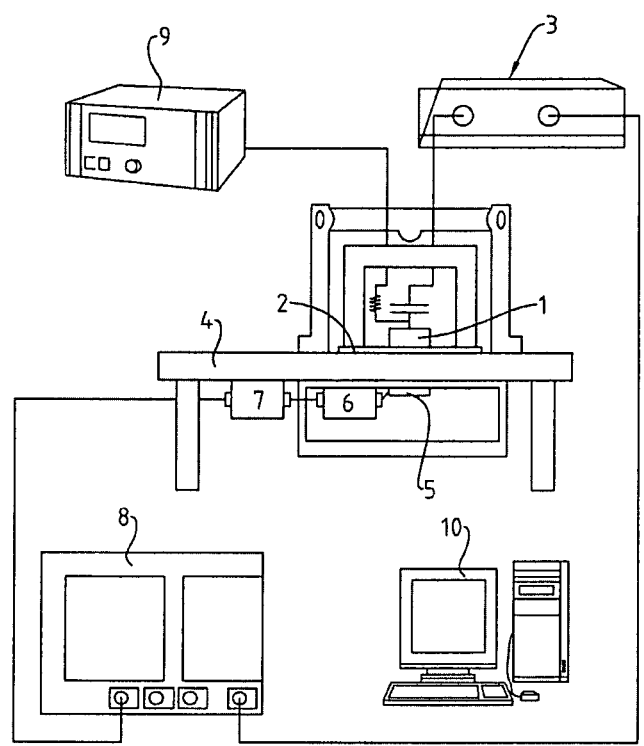

A system for implementing this PEA method is illustrated schematically in FIG. 1.

It includes a transmitter electrode 1 for transmitting a pulse into an item 2 to be analyzed, the item being made of a dielectric material, the electrode 1 being connected to a pulse generator 3, able to generate an acoustic wave passing through the item 2. The system also includes a support able to support the item 2 to be analyzed, said support being connected to a receiver electrode 4, equipped with a piezoelectric sensor 5 able to sense the acoustic wave generated by the pulse and able to convert it into an electric signal to represent the wave generated by the pulse on an oscilloscope, so as to analyze the geographic distribution of stored charges.

The system also includes an amplifier and filter 6 and 7 arranged at the output of the sensor, amplifying the signal so as to be able to analyze it and visualize it on an oscilloscope 8 arranged downstream. Lastly, the transmitter electrode 1 can be voltage-supplied by a power supply unit 9.

A computer 10 is connected to the oscilloscope 8 to receive the electric signal and analyze the data which it contains. The computer 10 is also connected to the pulse generator 3 so as to be informed of the parameters of the initial pulse transmitted by the transmitter electrode. The distribution of charges stored in said item can thus be determined and the results can be visualized in the form of tables or a three-dimensional representation, via the screen of the computer 10.

Such a system exhibits several drawbacks, including in particular that of distortion of the signal applied to the item 2 in particular during transmission of the pulse at the transmitter electrode 1.

The invention aims to achieve a system for transmitting at least one electric pulse which performs better than that illustrated in FIG. 1, by overcoming the drawbacks mentioned above.

The invention relates to a system for transmitting at least one electric pulse for an apparatus for determining a distribution of charges contained in the thickness of an item made of dielectric material, said transmission system including a transmitter electrode for transmitting at least one pulse and a generator of said pulse. The system according to the invention is notable in that the electrode is formed by a transmission line which is substantially level in relation to the item to be analyzed and which includes impedance matching means to keep said impedance substantially constant along said transmission line in the passband of said pulse.

The substantially level electrode combined with the impedance matching means enables the pulse to be transmitted without distortion.

Furthermore, the invention offers a more effective technical solution to match the impedance as compared with those proposed by the prior art which in particular make provision for introducing discrete components.

According to embodiments of invention, the system can comprise the following features, taken separately or in combination:
- the impedance matching means include electric link means between, on the one hand, the pulse generator and one end of the transmitter electrode, and, on the other hand, between a second end of the transmitter electrode and a load, the impedance of which is equal to the characteristic impedance of the electrode,
- the link means are coaxial cables,
- the impedance is substantially 50 ohms,
- said load is formed by a circuit for absorbing the signal, located downstream of said electrode,
- the system includes means for applying a polarizing electric voltage to said electrode and at least one capacitive decoupling device for said electrode arranged at one end of said electrode,
- said decoupling device includes at least one capacitor which is compatible with the electric voltage, and components for matching the impedance of said capacitor,
- said capacitor has an elongated shape and said matching components include at least one metal structure arranged in proximity to one connection end of said capacitor, said structure surrounding said capacitor substantially over its entire length,
- it includes at least two metal structures, each of the structures being arranged in proximity to one connection end of said capacitor, the two structures being separated by an insulating item belonging to the group comprising air, vacuum and a dielectric material,
- said structures are arranged tête-bêche, the free edges of the structures overlap around said capacitor, said decoupling device includes a casing comprising said capacitor and said matching components, said casing comprising at least two connectors and being connected to a ground plane, said capacitive decoupling device includes at least one microstrip line having a transversal cut, said transversal cut dividing said microstrip line into two parts which are interconnected by decoupling capacitors, said transmitter electrode includes a microstrip line having at each of its ends a traversing cut, dividing said microstrip line into two side parts and one central part, said central part being connected to each of the side parts by capacitors, each traversing-cut/capacitors/side-part assembly which is located at each end of said microstrip line forming a capacitive decoupling device.

The invention also relates to a capacitive decoupling device for a system for transmitting at least one electric pulse as defined above, notable in that it includes at least one capacitor which is compatible with the electric voltage, and components for matching the impedance of said capacitor.

According to other features of the device according to the invention, taken separately or in combination:

the capacitor has an elongated shape and said matching components include at least one metal structure arranged in proximity to one connection end of said capacitor, said structure surrounding the capacitor substantially over its entire length, the device includes at least two metal structures, each of the structures being arranged in proximity to one connection end of said capacitor, the two structures being separated by an insulating item belonging to the group comprising air, vacuum and a dielectric material, a structure exhibits a cup shape, said structures are arranged tête-bêche, the free edges of the structures overlap around said capacitor, the device includes a casing comprising said capacitor and said matching components, said casing comprising at least two connectors, the device includes at least one microstrip line having a transversal cut, said transversal cut dividing said microstrip line into two parts which are interconnected by decoupling capacitors.

Lastly, the invention relates to a transmitter electrode for a system for transmitting an electric pulse, as defined above, notable in that it includes a microstrip line having at each of its ends a traversing cut, dividing said microstrip line into two side parts and one central part, said central part being connected to each of the side parts by capacitors, each traversing-cut/capacitors side-part assembly which is located at each end of said microstrip line forming a capacitive decoupling device.

Figure 2:
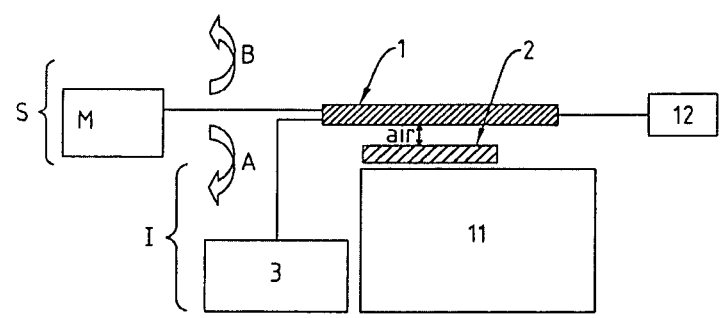
Figure 3:
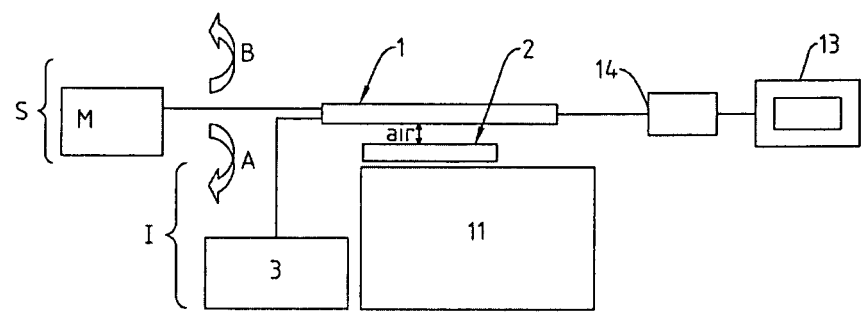
Figure 4:
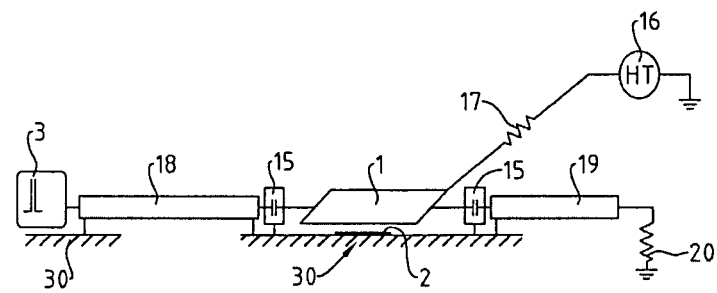
Figure 5:
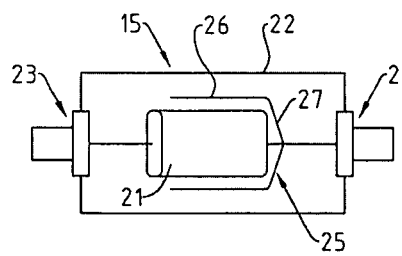
Figure 7:
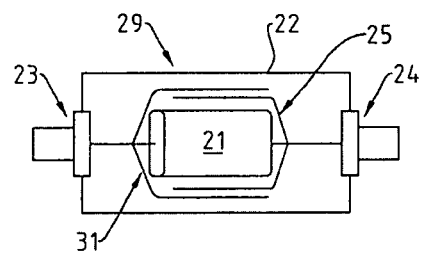
Figure 6:
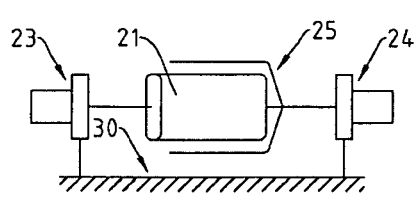
Figure 8:
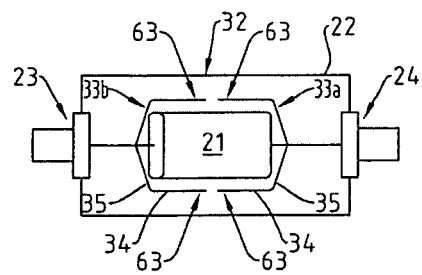
Figure 9:
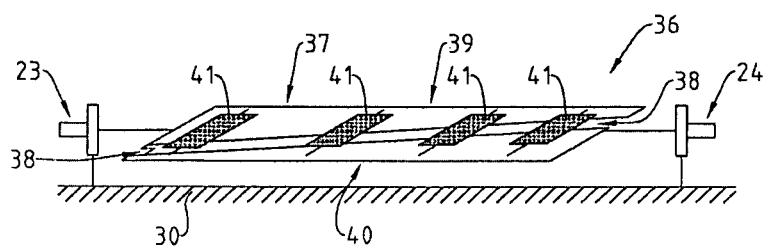
Figure 10:
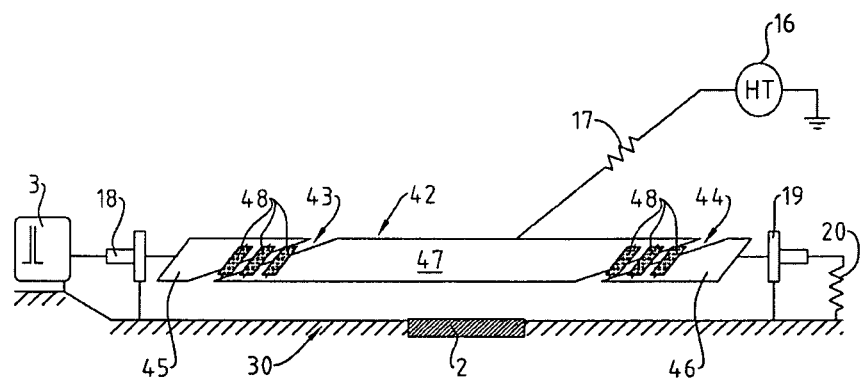

The invention will be better understood in light of the description of example embodiments of the invention, with reference to the appended drawings in which:

FIG. 1 schematically represents a system according to the prior art, as described earlier;

FIG. 2 schematically illustrates a first embodiment of a system for transmitting at least one electric charge according to the invention, implemented above an item made of dielectric material, the charge distribution of which must be determined, FIG. 3 schematically illustrates a second embodiment of a system according to the invention, implemented above an item made of dielectric material, the charge distribution of which must be determined, FIG. 4 schematically illustrates a third embodiment of a system according to the invention, implemented above an item made of dielectric material, the charge distribution of which must be determined, FIG. 5 is a view from above of a decoupling device according to the invention, according to a first embodiment, contained in a casing, FIG. 6 is a view similar to that of FIG. 5, in which the capacitive decoupling device is not contained in a casing, FIG. 7 is a view from above of a decoupling device according to the invention, according to a second embodiment, FIG. 8 is a view from above of a decoupling device according to the invention, according to a third embodiment, FIG. 9 is a side view of a decoupling device according to the invention, according to a fourth embodiment, and FIG. 10 illustrates a fifth embodiment of a decoupling device according to the invention, implemented above an item made of dielectric material, the charge distribution of which must be determined.

A first embodiment of a system for transmitting at least one electric charge according to the invention is now described with reference to FIG. 2.

FIG. 2 presents a schematic diagram of a complete apparatus, able to determine the charge distribution in a dielectric item 2.

The complete apparatus includes two parts: a top part S and a bottom part I. The top part S is detachable for example by being movably fitted between an analysis position, illustrated by the arrow bearing the reference A, where it faces the fixed part, and an irradiation position, illustrated by the arrow bearing the reference B, where it is moved away from the fixed part.

The apparatus according to this embodiment is equipped with motorized means M to make the movable part pass from position A to position B, or vice versa.

The movable top part S is, in the context of the present embodiment, formed by a system for transmitting at least one electric pulse according to a first embodiment of the invention which will be detailed later.

The bottom part of the apparatus is known per se and forms a signal detection and processing module 11.

The detection and processing module 11 includes a detection (or reception) electrode, connected to a piezoelectric sensor, the latter being in turn connected to a filter and to an amplifier. The output of the amplifier is connected to an oscilloscope for visualizing an electric signal, and in particular the electric signal from the acoustic wave capable of being generated by the movement of charges stored in an item 2, the distribution of which is desired to be determined.

Provision can be made to keep the item to be analyzed 2 on the electrode of the detection module 11 by a layer of adhesive.

The movable part S of the apparatus provides for transmitting to the item/sample 2 to be analyzed the pulse required for the generation of an acoustic wave which is characteristic of the charges which the item 2 contains, while minimizing the distortion of the pulse, in order to obtain the greatest possible precision on the quantity of charges detected and on how they are set out in the item 2.

The system S includes a transmitter electrode 1, one of the ends of which is connected to a pulse generator 3, and the other end of which is connected to a circuit 12, the impedance of which is equal to its characteristic impedance.

In the context of the present example embodiment, the impedance of the transmitter electrode 1 is fixed at 50Ω. The circuit 12 therefore also exhibits an impedance of 50Ω.

A transmission system is thus obtained in which the impedance seen by the pulse is substantially constant as it advances along the transmission line between the generator 3 and the load 20.

The circuit 12 is for preventing the return of the signal or pulse by "absorbing" the signal.

More specifically, reflection of the signal would complicate the analysis of the electric signal at the output of the piezoelectric sensor of the module 11: the signal analyzed would be representative of two acoustic waves generated by the charges, the first wave corresponding to a first movement of charges in response to the first pulse and the second wave corresponding to a second movement of charges in response to a return of the pulse.

The circuit 12 thus has the effect of absorbing the signal and preventing it from becoming distorted in the system S.

In one variant embodiment illustrated in FIG. 3, the circuit 12 is replaced by an oscilloscope 13 and a signal attenuator device 14 arranged upstream of the oscilloscope 13. The oscilloscope 13 is for observing the pulse after it has traveled along the transmission line and if necessary for measuring its distortion.

The circuit 12 or attenuator 14 is not indispensable if a return of the signal is tolerated if the round-trip time of the pulse is greater than the time required for measurement or analysis.

When the system according to the invention S is placed in the analysis position A, there is a space between the transmitter electrode 1 and the surface of the item to be analyzed 2, as part of a contactless implementation. This space, which can for example be air or a vacuum, forms a dielectric between the transmitter electrode 1 and the item to be analyzed 2.

The two examples of systems according to the present invention which are described above provide for preventing distortions of the signal or pulse when it propagates between the generator 3 and the transmitter electrode 1.

In the context of the example embodiments above, the electrodes are not subjected to any polarizing voltage.

However, for experimentation requirements, it is sometimes appropriate to polarize the electrode, i.e. to apply a DC electric voltage to it.

More specifically, by applying this voltage, standard values can be obtained, and/or the item 2 to be analyzed can be subjected to an electric field, and/or electric charges can be injected in the item 2 to be analyzed in order to measure their effects over time.

To achieve this polarization by applying a DC voltage to the electrode 1, the latter must also be decoupled, or in other words "electrically isolated", from other items included in the transmission system, in order to apply the DC voltage to the electrode 1 and only to it.

This is why two capacitor-based decoupling devices 15 are arranged on either side of the electrode 1 as illustrated in FIG. 4.

FIG. 4 shows the electrode 1 arranged above a sample item to be analyzed 2, the electrode 1 being connected at each of its ends to one of the two decoupling devices 15 and having a voltage applied to it by a high-voltage generator 16.

A very high-value resistor 17 is arranged between the high-voltage generator 16 and the electrode 1 to limit the current in the event of a short circuit.

To prevent any distortion of the signal, link means 18 and 19 of the same impedance as that of the electrode 1 are connected to a pulse generator 3 and to a load 20, respectively, having the same impedance as the electrode 1, resulting in the signal or pulse being absorbed.

However, for the transmission system to operate, the capacitive decoupling devices 15 must be matched with the impedance of the cables or link means 18 and 19 to which they are connected in order to prevent distortion of the pulse.

More specifically, in order to not disrupt the incident exciter voltage pulse, there must be no break in impedance between the polarized electrode 1 and the cables 18 and 19. By design, the high-voltage capacitors are not matched when they are merely placed between two items or "lines" exhibiting the same impedance, due to their geometry which introduces an imbalance in the parasitic self-inductance/parasitic capacitance ratio, which is a function of the capacitor structure.

The parasitic self-inductance of the capacitor is the self-inductance of its metal lengths. The parasitic capacitance of the capacitor is represented by the group of capacitances between its metal components and the ground reference.

Since the capacitance of the capacitor must be of sufficient value to form a short circuit for the exciter pulse, this requires bulky decoupling capacitors to be added to the device which brings about a mismatching of the transmission line.

Therefore, the decoupling devices 15, connected on either side of the electrode 1, as represented schematically in FIG. 4, are matched in accordance with the invention and form a subject of the device according to the invention, example embodiments of which will now be described with reference to FIGS. 5 to 9.

A first embodiment according to the invention of a matched decoupling device 15 is illustrated in FIGS. 5 and 6.

The capacitive decoupling device 15 includes a high-voltage capacitor 21 which is contained in a casing 22, and the terminals of which are connected to two connectors 23 and 24 of the casing 22. The two connectors 23 and 24 are for connecting the casing 22 to the cable 18 connected to the pulse generator and to one end of the transmitter electrode 1, respectively.

The capacitor 21 is a capacitor which is easily available commercially, and the capacitance of which is for example in the order of 250 pF up to a frequency that can reach 1 GHz.

The casing 22 is connected to a ground plane 30 (see FIGS. 4 and 6).

The means for matching the decoupling device 15 are means which enable the external parasitic capacitance of the capacitor to be increased.

To this end, and in accordance with the embodiment illustrated in FIGS. 5 and 6, the matching components are made up of a metal structure 25, produced (in the context of this example) substantially in the shape of a cup, i.e. in the shape of a metal hollow cylinder 26 having a closed cone-shaped end 27.

In the context of this embodiment, this metal structure 25 covers one of the ends of the capacitor 21, and the length of the metal hollow cylinder is substantially equal to, or even slightly greater than or less than, that of the capacitor, so as to substantially surround it completely.

An insulator, such as air, circulates between the metal structure and the capacitor 21.

Owing to the presence of this metal structure 25, the parasitic capacitance of the matched capacitive decoupling device 15 is higher than the parasitic capacitance of the capacitor 21 with respect to the ground reference. By increasing the capacitance, the parasitic self-inductance/parasitic capacitance ratio of the capacitor can be corrected so as to keep the transmission line matched.

The capacitive decoupling device 15 is thus matched and allows the pulse to be transmitted without distortion and a voltage to be applied to the electrode 1.

FIG. 7 shows a variant embodiment of a capacitive decoupling device 29 according to the invention, able to replace the decoupling device 15 illustrated in FIG. 4 in a transmission system according to the invention.

The capacitive decoupling device 29 also includes a casing 22 containing two connectors 23 and 24, like that of the casing of the decoupling device 15 described previously. Furthermore, the casing 22 includes a capacitor 21 connected to each of the connectors 23 and 24, the capacitor 21 being surrounded by a first metal structure 25 identical to that of the decoupling device 15 described previously, in the shape of a cup, covering one of the ends of the capacitor 21.

The capacitive decoupling device 29 also includes a second metal structure 31.

The second metal structure 31 also has a cup shape, with a metal hollow cylinder also closed at one end by a metal hollow cone.

The second metal structure 31 covers the other end of the capacitor 21 and is arranged tête-bêche with respect to the first metal structure 25.

The second metal structure 31 has dimensions greater than those of the first metal structure 25 so as to surround both the capacitor 21 and the structure 25.

Moreover, an electric insulating layer (of air in the present case) is arranged between the first 25 and second 31 metal structures.

Produced in this way, this second capacitive decoupling device 29 forms a capacitor, the parasitic capacitance of which is even higher than that of the device represented in FIGS. 5 and 6.

It must be understood that the invention is not limited to the presence of two metal structures, and that the capacitance device according to the invention could comprise more than two of them.

FIG. 8 shows yet another embodiment of a capacitive decoupling device according to the invention.

The capacitive decoupling device 32 also includes a casing 22 with two connectors 23 and 24, like that of the casing of the decoupling devices 15 or 22 described previously. Furthermore, the casing 22 includes a capacitor 21 connected to each of the connectors 23 and 24.

The capacitor 21 is surrounded by a first metal structure 33a in the shape of a cup surrounding one of the ends of the capacitor 21.

The metal structure 33a thus includes a hollow metal cylinder 34 closed at one of its ends by a hollow metal cone 35. The diameter of the cylinder 34 is identical to that of the cylinder 26 of the structure 25. However, the cylinder 34 is of shorter length, substantially equal to half the length of the capacitor 21.

The capacitor is surrounded by a second metal structure 33b identical to that of the first metal structure 33a, covering the other end of the capacitor and arranged tête-bêche with respect to the first metal structure 33a.

A layer of air separates the inner walls of the two cylinders 34 from the surface of the capacitor 21. Another layer of air separates the two respective free ends 63 of the two hollow cylinders 34 facing one another.

Such an embodiment also provides for achieving a capacitive decoupling device 32, the parasitic capacitance of which provides for obtaining the correct parasitic self-inductance/parasitic capacitance ratio of the capacitor, so as to keep the transmission line matched.

The characteristic impedance Zc is as follows:

$$Z_c = \sqrt{(L_p/C_p)}$$

where

Lp is the parasitic self-inductance, and
Cp is the parasitic capacitance.

The preceding description gives examples of means for achieving, from existing commercially available capacitors, capacitors that are matched for a transmission system according to the invention.

It must however be understood that the invention is not limited to technical means which result in matching existing capacitors, and that it covers any other means providing a capacitive decoupling of the transmitter electrode 1 in a transmission system as described above, i.e. a system which prevents any distortion of the pulse when it is being transmitted by the electrode 1, and where the electrode is subjected to a high voltage for experimentation requirements.

FIG. 9 illustrates for example another embodiment of a capacitive decoupling device.

Thus, a capacitive decoupling device 36 as illustrated in FIG. 9 may replace a capacitive decoupling device 15 of the transmission system illustrated in FIG. 4.

The decoupling device 36 is illustrated in side view and in perspective. The casing 22 which contains the device 36 is not represented in the drawing. Only the connectors 23 and 24 connected to the ground plane 30 are represented.

It must however be understood that the decoupling device 36 includes a casing 22 similar to those of the decoupling devices 15, 29 or 32 described previously.

The decoupling device 36 includes a microstrip line 37 made for example of copper.

The microstrip line 37 has a transversal cut 38, such that it is divided into two parts 39 and 40 separated by the cut 38.

The parts 39 and 40 of the microstrip line 37 are connected one to the connector 23 and the other to the connector 24 of the casing 22, respectively.

The cut 38 is made along a diagonal of the microstrip line 37, such that it has the longest possible length for reasons which will now be explained.

The two parts 39 and 40 are interconnected by capacitors 41 having lower individual capacitances than those of the capacitors 21 used as part of the embodiments of the devices 15, 29, 32 described previously.

The greater the length of the slit, the more capacitors that can be provided between the two parts 39 and 40 of the microstrip line. To obtain a very long slit, it can for example be arranged along a diagonal of the microstrip line 37.

It must however be understood that a device can be achieved using a microstrip line having a cut into two parts made along its length, or its width, or along any other rectilinear or sinuous design, without thereby departing from the scope of the invention.

By virtue of such an embodiment, a capacitive decoupling device 36 formed by the microstrip line 37 with the cut 38 and the capacitors 41, which is capable of withstanding very high voltage values, for example 10,000 volts, applied to the transmitter electrode 1 to which it is connected, can be achieved. The size of the capacitors 41 is small enough to not require individual impedance matching of the type of that of the examples of FIGS. 5 to 8.

A device capable of withstanding such a voltage can include a microstrip line, the dimensions of which adhere to the rule that follows.

Let W be the width of the strip (or conducting track) of the microstrip line, and h the thickness of the dielectric material on which the strip (or track) is placed. The calculation of the ratio W/h corresponding to a fixed impedance $Z_o$ is given by the following formula:

for W/h>2:

$$\frac{W}{h} = \frac{2}{\pi}\left\{B - 1 - \ln(2B-1) + \frac{\varepsilon_r + 1}{2\varepsilon_r}\left[\ln(B-1) + 0,39 - \frac{0,61}{\varepsilon_r}\right]\right\}$$

where $$B = \frac{377\pi}{2Z_0\sqrt{\varepsilon_r}}$$

and where:

| | |
|---|---|
| $Z_0$ | characteristic impedance of the line |
| W | width of the track |
| t | thickness of the track |
| h | thickness of the dielectric |
| $\varepsilon_r$ | dielectric constant of the insulating material (relative permittivity) |

The dimensions of the microstrip line will be calculated so as not to exceed 10 kV/mm.

The width of the cut 38 will be, in the context of this example embodiment, at least 1 mm.

FIG. 10 shows yet another transmission system according to the invention, applying the principle of implementation of the capacitive decoupling device 36 illustrated in FIG. 9 to a transmitter electrode 42.

In a manner similar to the system illustrated in FIG. 4, the transmitter electrode is arranged above a sample item to be analyzed 2 and a voltage is applied to it by a high-voltage generator 16.

A very high-value resistor 17 is arranged between the high-voltage generator 16 and the electrode 42, so as to decouple the power supply from the electrode when the DC voltage is being applied.

To prevent distortion of the signal, link means 18 and 19 of the same impedance as that of the electrode 42 are connected to a pulse generator 3 and to a load 20, respectively, having the same impedance, resulting in the signal or pulse being absorbed.

To ensure that the system operates, instead of adding two decoupling devices 15 or 29 or 32 for 36 matched with the impedance of the cables 18 and 19, and with the impedance of the transmitter electrode, the electrode 1 formed by a microstrip line is replaced by the electrode 42 which is modified to provide total decoupling of one of its parts.

To this end, two transversal cuts 43 and 44 are made along the entire width of the microstrip line so as to be substantially parallel with each other, each cut being made in proximity to each of the ends of the microstrip line 42. It must be understood that the cuts could have different orientations without departing from the scope of the invention.

The microstrip line thus has three parts, two end parts 45 and 46 of which are connected to the connectors of the link means 18 and 19 respectively, and one central part 47 of which is connected to the high-voltage generator 16.

The central part 47 faces the item sample 2, the charge distribution of which must be analyzed. It is this part 47 of the microstrip line which will transmit the pulse for determining the charge distribution in the item sample 2.

The end parts 45 and 46 are connected to the central part 47 by individual capacitors 48, which can be the same as the capacitors 41 used in the embodiment of the device 36, or which can be different.

Thus, each end part 45 and 46, in combination with the central part 47 and the capacitors 48 which connect it with the central part 47, forms a capacitive decoupling device.

It results from the preceding description that the transmission system according to the invention provides for propagating the signal or pulse transmitted by the generator 3 up to the transmitter electrode 1 or 42 without distortion, thereby ensuring that improved results are obtained over conventional systems of the prior art, concerning the distribution of charges in the item sample 2 to be analyzed. It is also understood how, at the same time, the invention enables an isolation (or an electric decoupling) of the electrode in order to allow a voltage to be applied to the latter.

It must however be understood that the invention is not limited specifically to the embodiments which are described and illustrated in the drawings, and which are presented purely by way of example embodiments.

In particular, the dimensions and shapes of the means providing the decoupling of the transmitter electrode could be different without however departing from the scope of the invention.

The invention claimed is:

1. A system for transmitting at least one electric pulse for an apparatus for determining a distribution of charges contained in the thickness of an item (2) made of dielectric material, said transmission system including a transmitter electrode (1, 42) for transmitting at least one pulse and a generator (3) of said pulse, characterized in that said electrode is formed by a transmission line (1) which is substantially level in relation to the item (2) to be analyzed and which includes impedance matching means to keep said impedance substantially constant along said transmission line in the passband of said pulse, and characterized in that said impedance matching means (12, 13, 14, 18, 19, 20) include electric link means (18, 19) between, on the one hand, the pulse generator (3) and one end of the transmitter electrode (1, 42), and, on the other hand, between a second end of the transmitter electrode and a load (20), the impedance of which is equal to the characteristic impedance of the electrode.

2. A system according to claim 1, characterized in that said link means (18, 19) are coaxial cables.

3. A system according to claim 1 characterized in that said impedance is substantially 50 ohms.

4. A system according to claim 1, characterized in that said load is formed by a circuit (12; 13, 14) for absorbing the signal, located downstream of said electrode (1, 42).

5. A system according to claim 1, characterized in that it additionally includes means (16, 17) for applying a polarizing electric voltage to said electrode (1, 42) and at least one capacitive decoupling device (15, 29, 32, 36) for said electrode (1, 42) arranged at one end of said electrode.

6. A transmitter electrode for a system according to claim 5, characterized in that it includes a microstrip line (42) having at each of its ends a traversing cut (43, 44), dividing said microstrip line (42) into two side parts (45, 46) and one central part (47), said central part (47) being connected to each of the side parts (45, 46) by capacitors (48), each traversing-cut (43, 44)/capacitors (48)/side-part (45, 46) assembly which is located at each end of said microstrip line (42) forming a capacitive decoupling device.

7. A system according to claim 5, characterized in that said capacitive decoupling device includes at least one microstrip line (37) having a transversal cut (38), said transversal cut (38) dividing said microstrip line (37) into two parts (39, 40) which are interconnected by decoupling capacitors (41).

8. A system according to claim 5, characterized in that said transmitter electrode (42) includes a microstrip line (42) having at each of its ends a traversing cut (43, 44), dividing said microstrip line (42) into two side parts (45, 46) and one central part (47), said central part (47) being connected to each of the side parts (45, 46) by capacitors (48), each traversing-cut (43, 44)/capacitors (48)/side-part (45, 46) assembly which is located at each end of said microstrip line (42) forming a capacitive decoupling device.

9. A system according to claim 5, characterized in that said decoupling device (15, 29, 32, 36) includes at least one capacitor (21) which is compatible with the electric voltage, and components (25, 31, 33a and 33b) for matching the impedance of said capacitor.

10. A system according to claim 9, characterized in that said capacitor has an elongated shape and said matching components (25, 31, 33a, 33b) include at least one metal structure (25, 31, 33a, 33b) arranged in proximity to one connection end of said capacitor (21), said structure surrounding said capacitor (21) substantially over its entire length.

11. A system according to claim 9, characterized in that said decoupling device (15, 29, 32) includes a casing (22) comprising said capacitor (21) and said matching components (25, 31, 33a, 33b), said casing (22) comprising at least two connectors (23, 24) and being connected to a ground plane.

12. A system according to claim 9, characterized in that it includes at least two metal structures (25, 31, 33a, 33b), each of the structures (25, 31, 33a, 33b) being arranged in proximity to one connection end of said capacitor (21), the two structures (25, 31, 33a, 33b) being separated by an insulating item belonging to the group comprising air, vacuum and a dielectric material.

13. A system according to claim 12, characterized in that said structures (25, 31, 33a, 33b) are arranged tête-bêche.

14. A system according to claim 13, characterized in that the free edges of the structures (25, 31, 33a, 33b) overlap around said capacitor (21).

15. A capacitive decoupling device for a system for transmitting at least one electric pulse as defined according to claim 5, characterized in that it includes at least one capacitor (21) which is compatible with the electric voltage, and components (25, 31, 33a and 33b) for matching the impedance of said capacitor.

16. A device according to claim 15, characterized in that it includes a casing (22) comprising said capacitor (21) and said matching components (25, 31, 33a, 33b), said casing (22) comprising at least two connectors (23, 24).

17. A device according to claim 15, characterized in that it includes at least one microstrip line (37) having a transversal cut (38), said transversal cut (38) dividing said microstrip line (37) into two parts (39, 40) which are interconnected by decoupling capacitors (41).

18. A device according to claim 15, characterized in that said capacitor has an elongated shape and said matching components (25, 31, 33a, 33b) include at least one metal structure (25, 31, 33a, 33b) arranged in proximity to one connection end of said capacitor (21), said structure surrounding said capacitor (21) substantially over its entire length.

19. A device according to claim 18, characterized in that a structure (25, 31, 33a, 33b) exhibits a cup shape.

20. A device according to claim 15, characterized in that it includes at least two metal structures (25, 31, 33a, 33b), each of the structures (25, 31, 33a, 33b) being arranged in proximity to one connection end of said capacitor (21), the two structures (25, 31, 33a, 33b) being separated by an insulating item belonging to the group comprising air, vacuum and a dielectric material.

21. A device according to claim 20, characterized in that said structures (25, 31, 33a, 33b) are arranged tête-bêche.

22. A device according to claim 21, characterized in that the free edges of the structures (25, 31, 33a, 33b) overlap around said capacitor (21).

* * * * *